US010937822B2

(12) United States Patent
Shimotsusa et al.

(10) Patent No.: US 10,937,822 B2
(45) Date of Patent: *Mar. 2, 2021

(54) PHOTOELECTRIC CONVERSION DEVICE AND MANUFACTURING METHOD OF THE PHOTOELECTRIC CONVERSION DEVICE

(71) Applicant: CANON KABUSHIKI KAISHA, Tokyo (JP)

(72) Inventors: Mineo Shimotsusa, Machida (JP); Masatsugu Itahashi, Yokohama (JP); Yusuke Onuki, Fujisawa (JP); Nobuaki Kakinuma, Tokyo (JP); Masato Fujita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/286,284

(22) Filed: Feb. 26, 2019

(65) Prior Publication Data

US 2019/0198537 A1  Jun. 27, 2019

Related U.S. Application Data

(63) Continuation of application No. 15/828,231, filed on Nov. 30, 2017, now Pat. No. 10,263,029, which is a (Continued)

(30) Foreign Application Priority Data

Oct. 30, 2014 (JP) .............................. JP2014-222044

(51) Int. Cl.
*H01L 27/146* (2006.01)

(52) U.S. Cl.
CPC .... *H01L 27/1463* (2013.01); *H01L 27/14612* (2013.01); *H01L 27/14614* (2013.01); *H01L 27/14641* (2013.01); *H01L 27/14689* (2013.01)

(58) Field of Classification Search
None
See application file for complete search history.

(56) References Cited

U.S. PATENT DOCUMENTS

| 10,263,029 B2* | 4/2019 | Shimotsusa ....... H01L 27/14614 |
| 2003/0008437 A1* | 1/2003 | Inoue .................. H01L 21/6835 438/149 |
| 2013/0089963 A1* | 4/2013 | Mishima ............... H01L 27/088 438/301 |

FOREIGN PATENT DOCUMENTS

| JP | 2008-210869 A | 9/2008 |
| JP | 2010-056516 A | 3/2010 |

(Continued)

*Primary Examiner* — Alexander G Ghyka
(74) *Attorney, Agent, or Firm* — Canon U.S.A., Inc. IP Division

(57) ABSTRACT

A manufacturing method includes a first process for forming a first gate electrode for a first MOS transistor and a second gate electrode for a second MOS transistor on a substrate including a semiconductor region defined by an insulator region for element isolation, a second process for masking a portion located above the semiconductor region of the first gate electrode to introduce an impurity to a source-drain region of the first MOS transistor, and a third process for forming a first conductor member being in contact with the portion of the first gate electrode through a first hole disposed on an insulator member covering the substrate and a second conductor member being in contact with the second gate electrode through a second hole disposed on the insulator member.

30 Claims, 10 Drawing Sheets

Related U.S. Application Data continuation of application No. 14/925,921, filed on Oct. 28, 2015, now Pat. No. 9,865,637.

(56) References Cited

FOREIGN PATENT DOCUMENTS

| | | |
|---|---|---|
| JP | 2010-114324 A | 5/2010 |
| JP | 2011-029604 A | 2/2011 |
| JP | 2011-077072 A | 4/2011 |
| JP | 2013-084740 A | 5/2013 |
| JP | 2014-045088 A | 3/2014 |

* cited by examiner

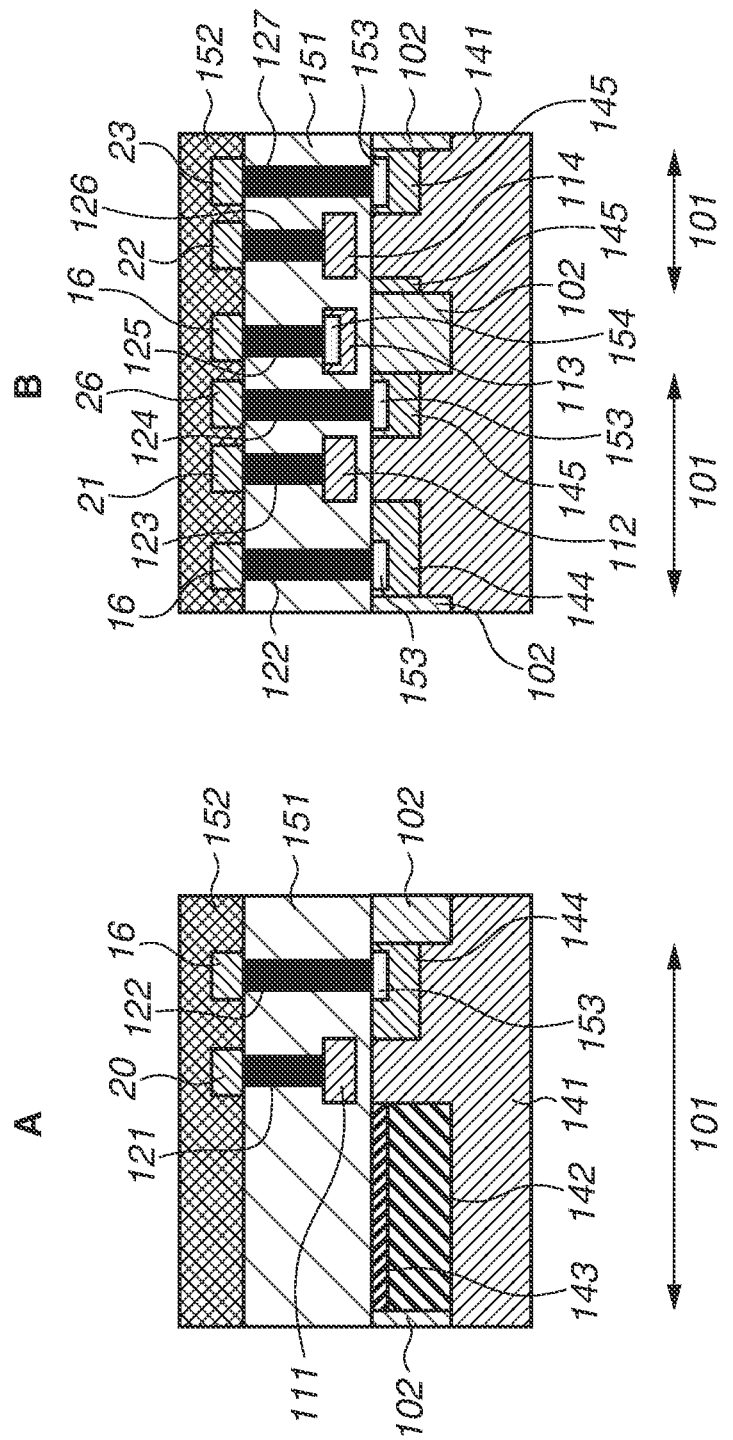

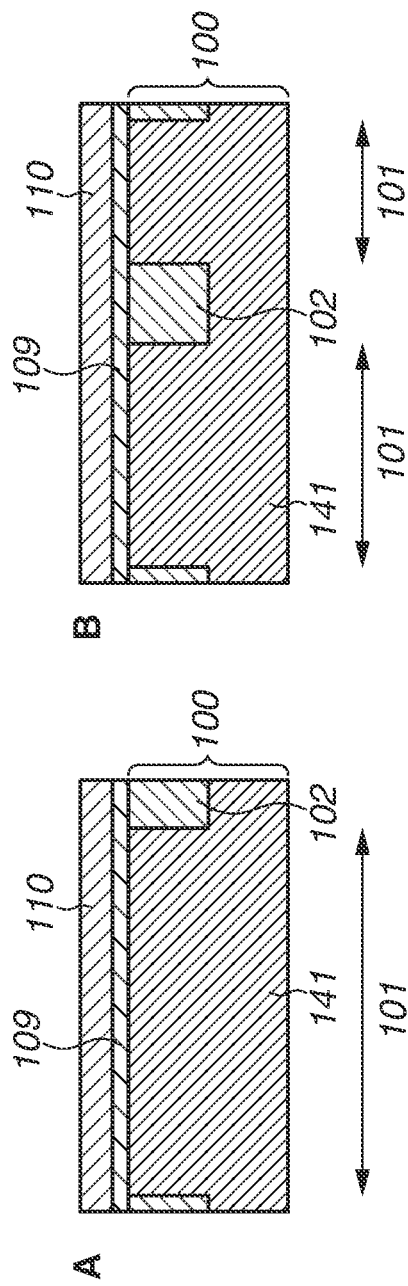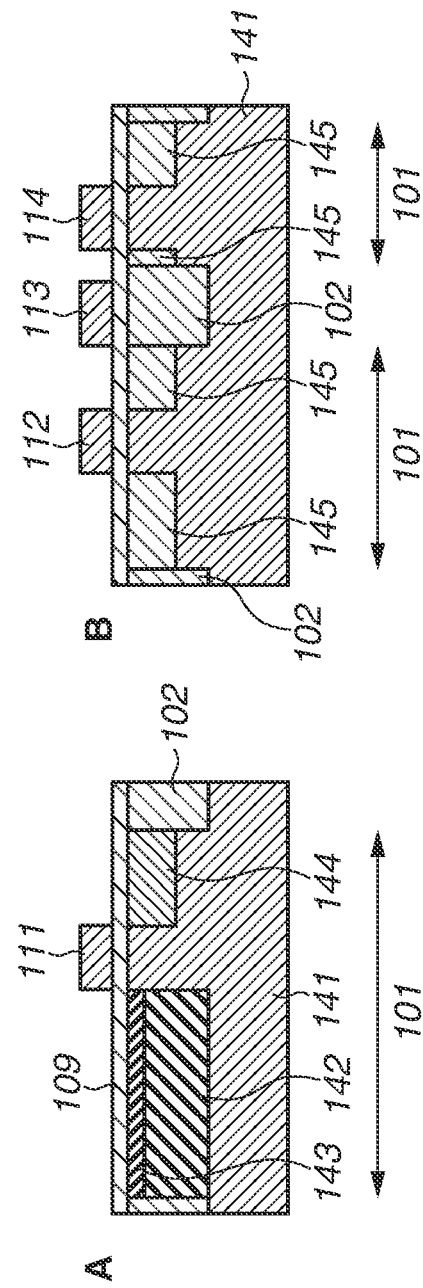

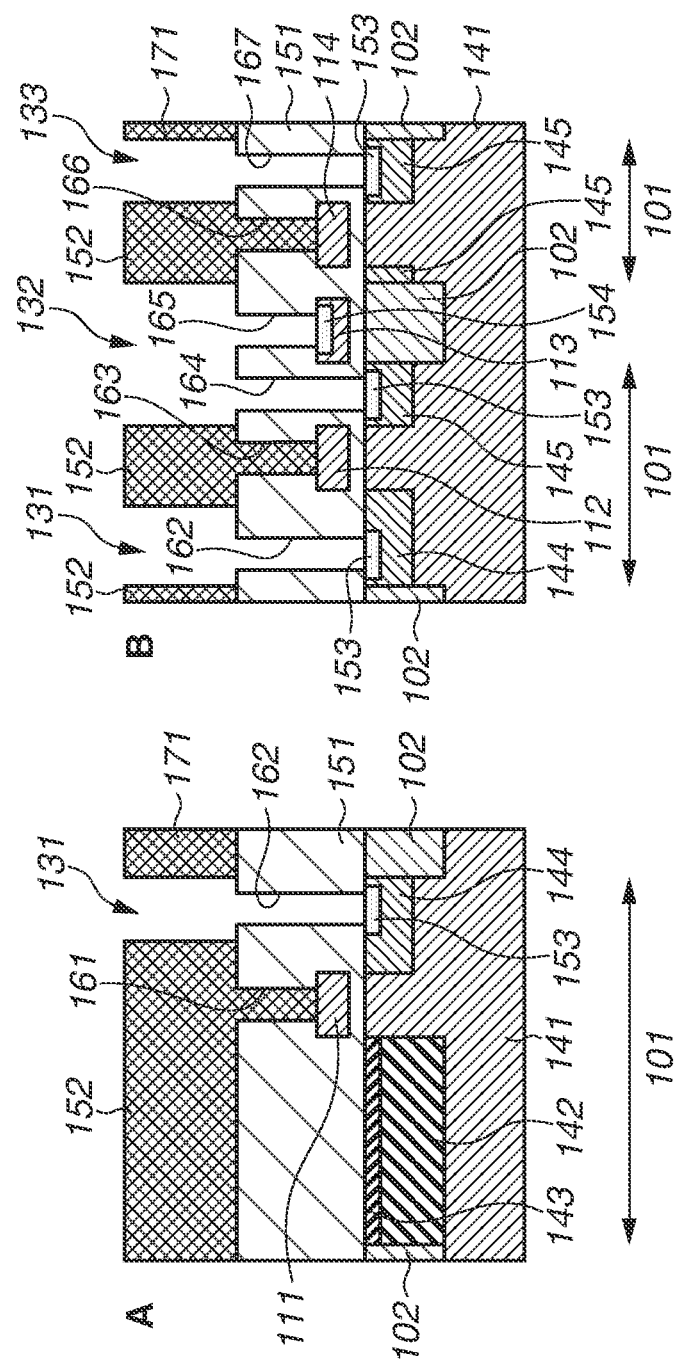

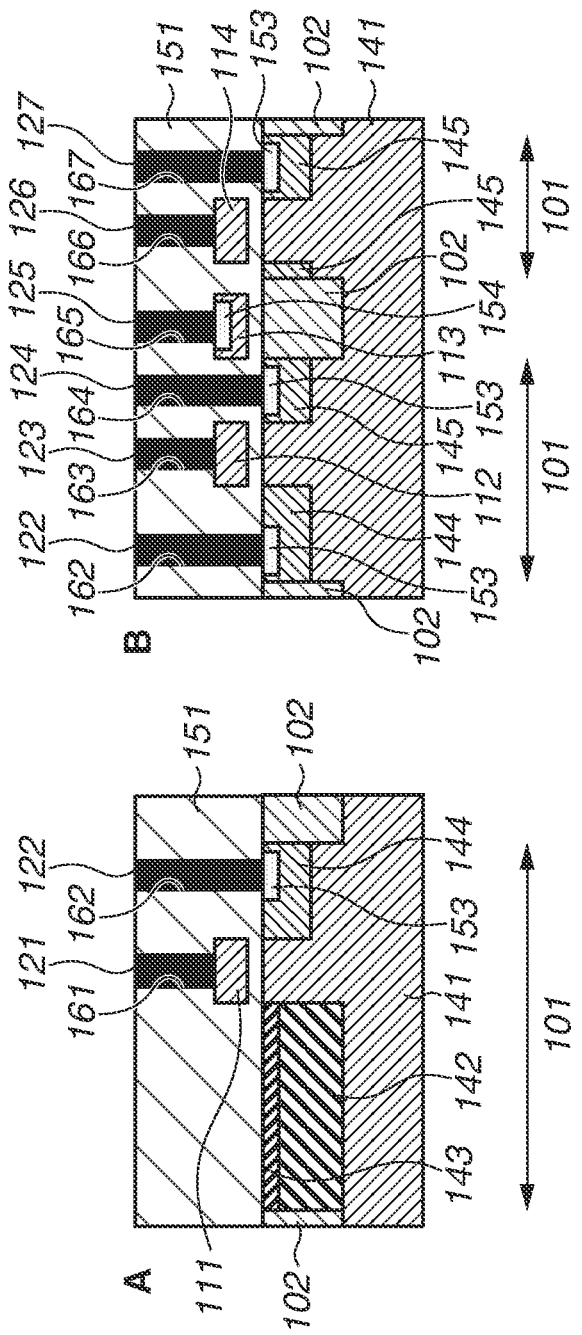

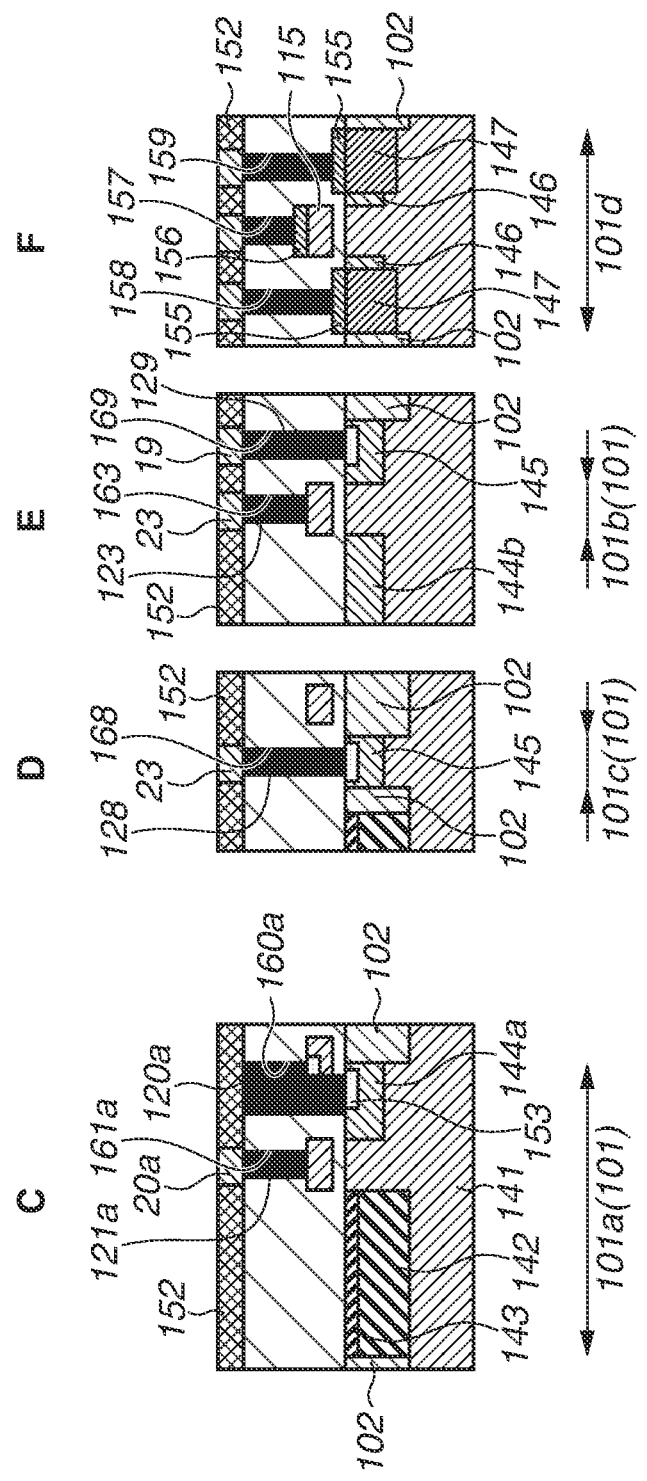

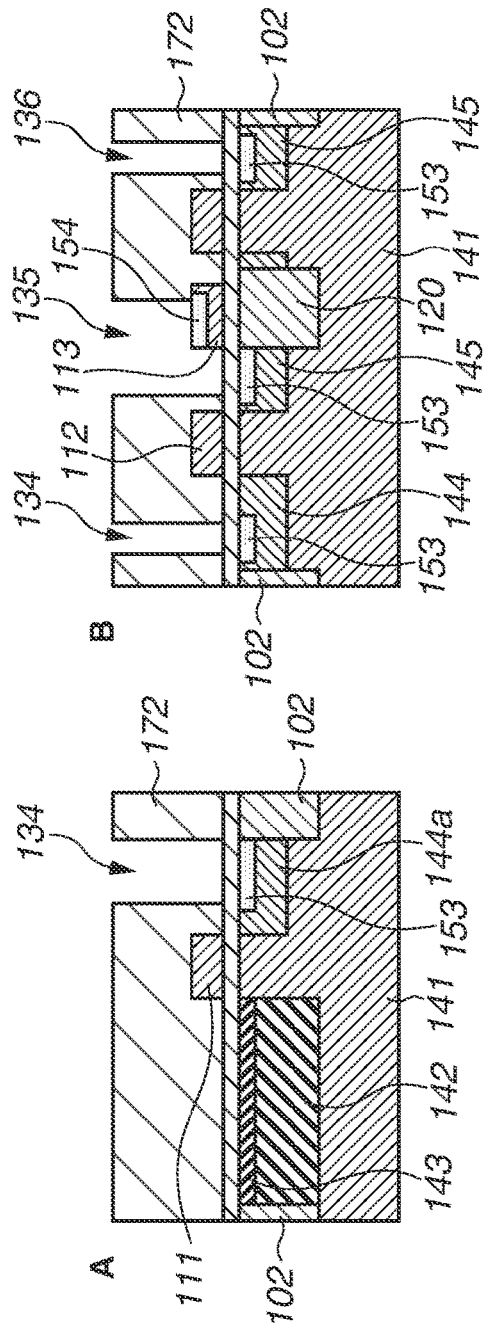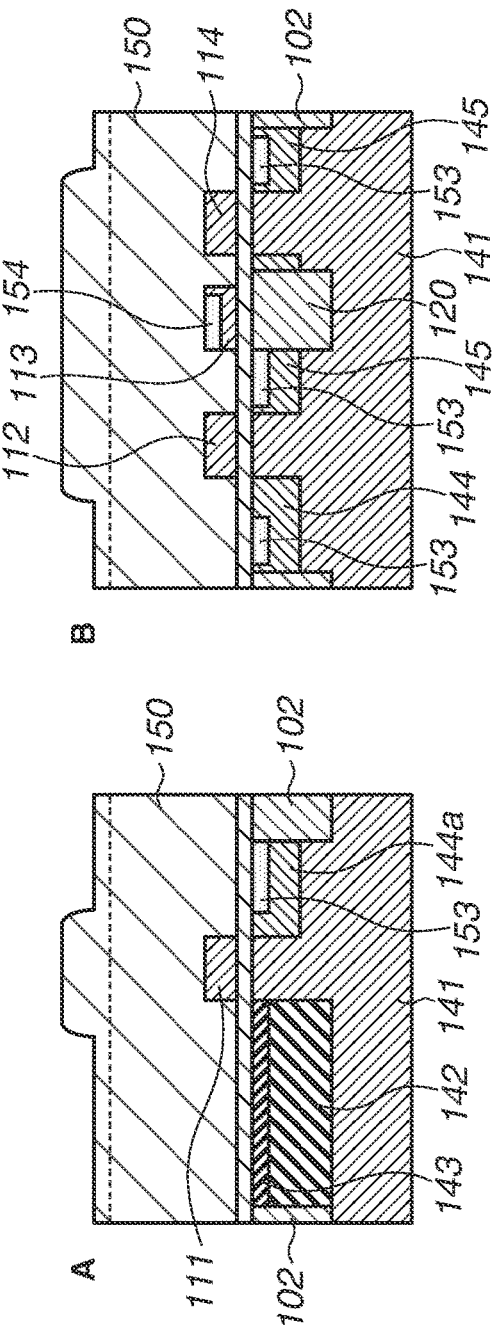

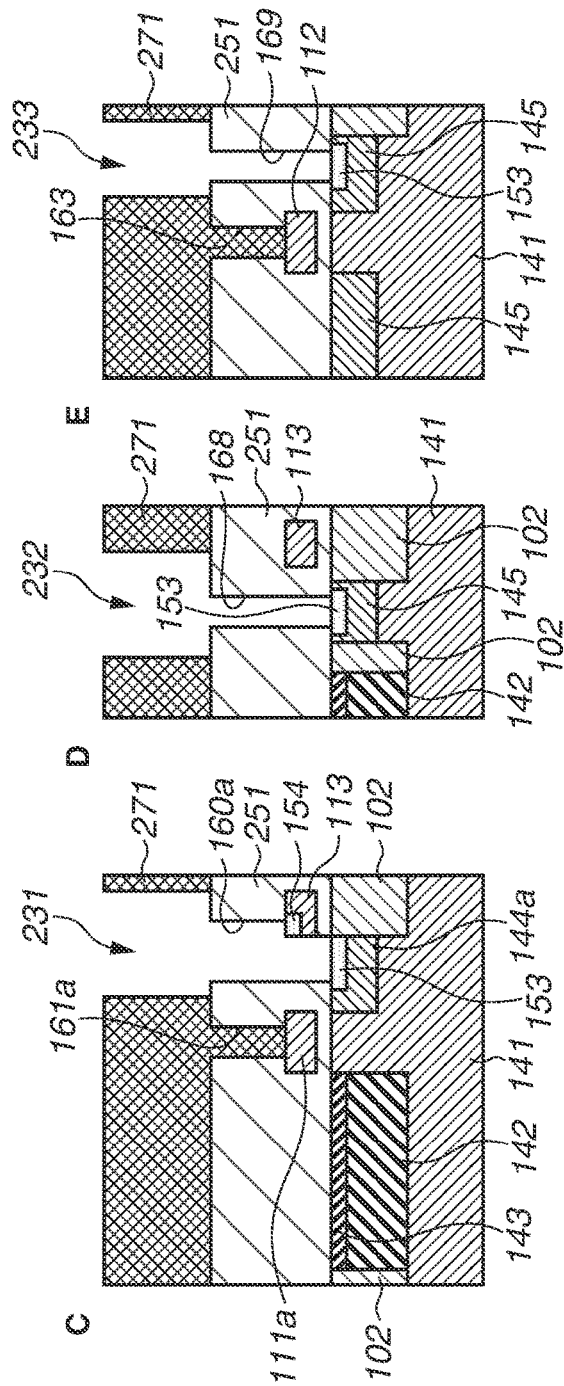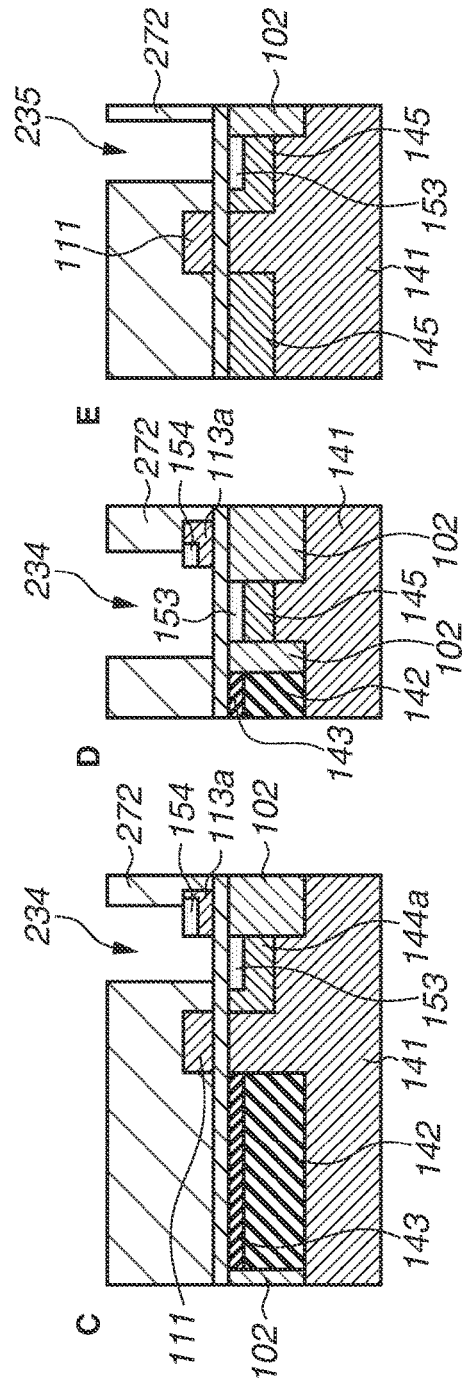

PHOTOELECTRIC CONVERSION DEVICE AND MANUFACTURING METHOD OF THE PHOTOELECTRIC CONVERSION DEVICE

CROSS REFERENCE TO RELATED APPLICATIONS

The present application is a continuation of U.S. patent application Ser. No. 15/828,231, filed on Nov. 30, 2017 which is a continuation of U.S. patent application Ser. No. 14/925,921, filed on Oct. 28, 2015 which issued as U.S. Pat. No. 9,865,637 on Jan. 9, 2018, which claims priority from Japanese Patent Application No. 2014-222044 filed Oct. 30, 2014, all of which are hereby incorporated by reference herein in their entirety.

BACKGROUND OF THE INVENTION

Field of the Invention

The present technique relates to a photoelectric conversion device including a metal oxide semiconductor (MOS) transistor.

Description of the Related Art

In a photoelectric conversion device, such as an image sensor, millions to tens of millions of pixel circuits are arranged, and a signal from the pixel circuit may be used as a pixel signal. Expansion of an area of a light receiving region of a photoelectric conversion element is effective to improve a sensitivity and a saturated electron amount of the photoelectric conversion element. In order to expand the area of the light receiving region of the photoelectric conversion element, it is necessary to reduce an area other than the light receiving region of the pixel circuit.

In a paragraph 0025 of Japanese Patent Application Laid-Open No. 2013-84740, it is described that a first contact plug (321) connected to a transfer gate electrode (121) is arranged on a first active portion (2A) such as on a channel region.

In miniaturization and a layout change of devices in the pixel circuit, there are restrictions in manufacturing processes of the photoelectric conversion device and in characteristics of an MOS transistor in the pixel circuit. When a contact plug is arranged on a channel region as in the case of Japanese Patent Application Laid-Open No. 2013-84740, there is a possibility of deteriorating characteristics of a transistor. The present technique is directed to improvement in performance of a pixel circuit.

SUMMARY OF THE INVENTION

According to an aspect of means of solving the above-described issue, a manufacturing method of a photoelectric conversion device in which a pixel circuit including a metal oxide semiconductor (MOS) transistor is arranged, the manufacturing method includes a first process for forming a gate electrode and a source-drain region of the MOS transistor, a second process for masking a first portion in the gate electrode, the first portion being constituted by polysilicon and located above a channel region of the MOS transistor, and introducing an impurity having a conductivity type same as that of the source-drain region to a second portion located in the source-drain region, and a third process for forming a conductor member being in contact with the first portion through a first hole disposed on an insulator member covering the MOS transistor and a conductor member being in contact with the second portion through a second hole disposed on the insulator member.

Further features of the present invention will become apparent from the following description of exemplary embodiments with reference to the attached drawings.

BRIEF DESCRIPTION OF THE DRAWINGS

FIGS. 2A to 2C are schematic diagrams illustrating pixel circuits according to a first exemplary embodiment.

FIGS. 3A to 3D are schematic diagrams illustrating a manufacturing method of the photoelectric conversion device.

FIGS. 4A to 4C are schematic diagrams illustrating pixel circuits according to a second exemplary embodiment.

FIGS. 5A to 5D are schematic diagrams illustrating the manufacturing method of the photoelectric conversion device.

DESCRIPTION OF THE EMBODIMENTS

Figure 1:
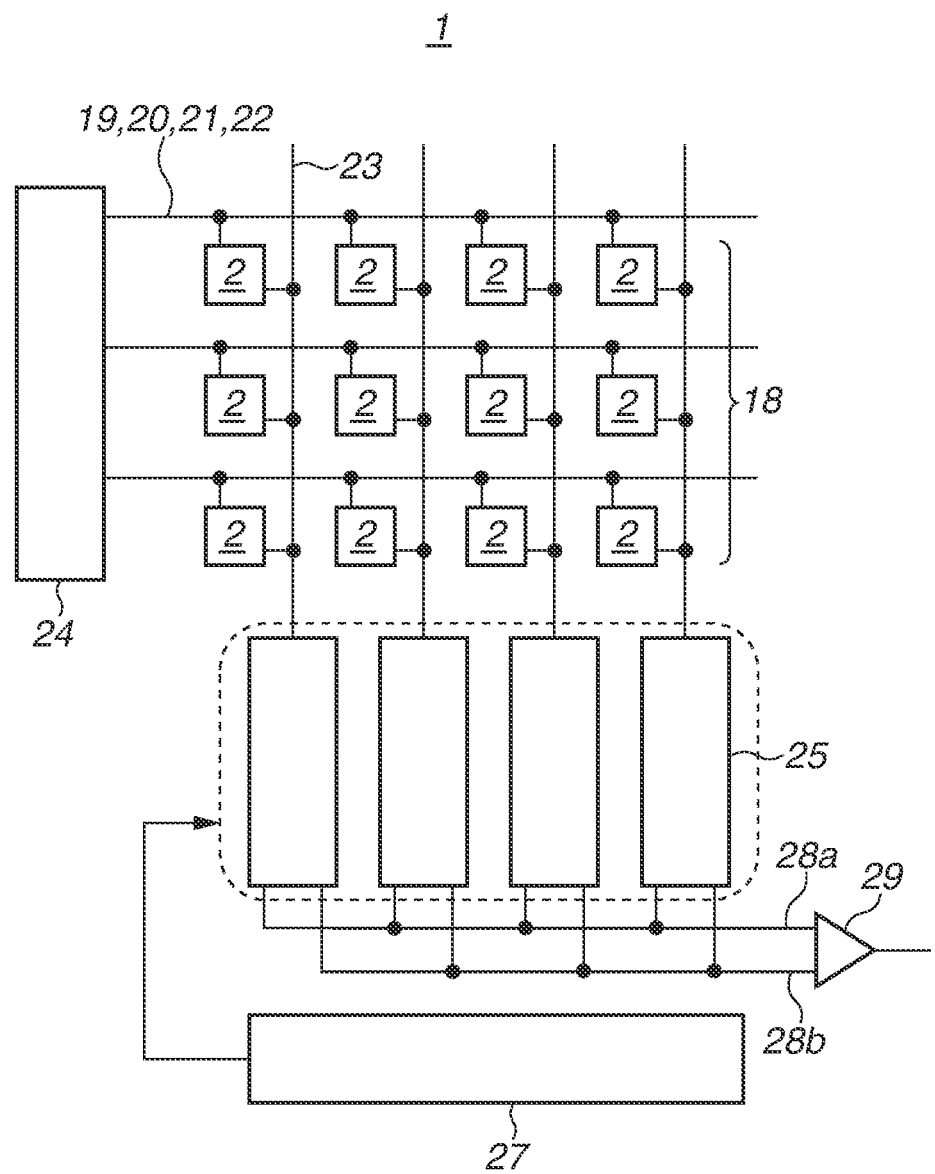
FIG. 1 is a schematic diagram illustrating a photoelectric conversion device.

Various exemplary embodiments will be described below with reference to the attached drawings. The common reference numerals are used for the common configurations throughout a plurality of the drawings in the following descriptions and drawings. Therefore, the common configurations are described by mutually referring to the plurality of the drawings, and the descriptions of the configurations with the common reference numerals are properly omitted.

First, an outline of a configuration of a photoelectric conversion device is described which is common to a plurality of exemplary embodiments.

FIG. 1 illustrates an example of a circuit configuration of a photoelectric conversion device 1. The photoelectric conversion device 1 can include a pixel unit 18, a driving unit 24, a signal processing unit 25, a control unit 27, and an output unit 29. The pixel unit 18 includes a plurality of pixel circuits 2 which are arranged to constitute a plurality of rows and a plurality of columns. The pixel circuit 2 includes at lease a photoelectric conversion element and a plurality of MOS transistors for generating a signal from a charge generated by the photoelectric conversion element. In FIG. 1, a configuration in which the pixel circuits 2 are arranged in three rows by four columns is illustrated to facilitate understanding. The plurality of pixel circuits 2 of the pixel unit 18 is connected to the driving unit 24 by a power source line 19 and signal lines 20, 21, and 22 and also connected to the signal processing unit 25 by an output signal line 23.

The driving unit 24 includes, for example, a shift register and outputs a driving signal to the pixel unit 18 according to a clock signal to drive each pixel circuit 2 by row. The signal processing unit 25 is disposed corresponding to each column and reads a signal by column from each pixel circuit 2 output in response to the above-described driving signal. Each signal read by the signal processing unit 25 is horizontally transferred via transfer units 28a and 28b according to a control signal from the control unit 27 and sequentially output from the output unit 29 by column.

The signal processing unit 25 can perform processing on a signal from the pixel circuit 2 by a circuit configuration according to, for example, a correlated double sampling (CDS) method. The signal processed by the signal processing unit 25 is amplified by the output unit 29 and can be output as a signal. The signal processing unit 25 can include an amplifier circuit and an analog-to-digital (AD) conversion circuit as well.

The photoelectric conversion device 1 can further include a package for housing a semiconductor substrate. The package can include a base body to which a chip including the above-described pixel unit 18 and others are fixed, a lid body facing the chip, and a connection member, such as a wire bonding and a lead frame enabling exchange of signals between the chip and the outside.

The photoelectric conversion device 1 is configured as at least one of an imaging device (an image sensor), a focus detection device (an automatic focus (AF) sensor), and a photometric device (an automatic exposure (AE) sensor). The photoelectric conversion device 1 can have a plurality of sensor functions and be configured as, for example, an imaging device capable of detecting a focus by an imaging plane phase difference method. An imaging system can be constituted using the photoelectric conversion device. The imaging system is an information terminal including a camera and an imaging function. The imaging system can include a signal processing device for processing a signal obtained from the photoelectric conversion device and a display device for displaying an image captured by the photoelectric conversion device.

Next, a configuration of the photoelectric conversion device according to a first exemplary embodiment is described below with reference to FIGS. 2A to 2C.

Figure 2B:
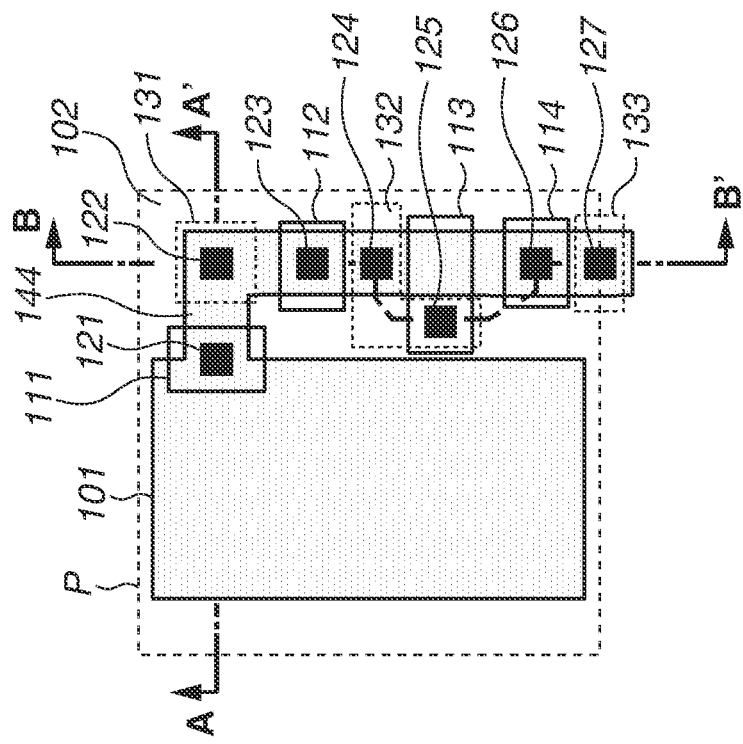
Figure 2A:
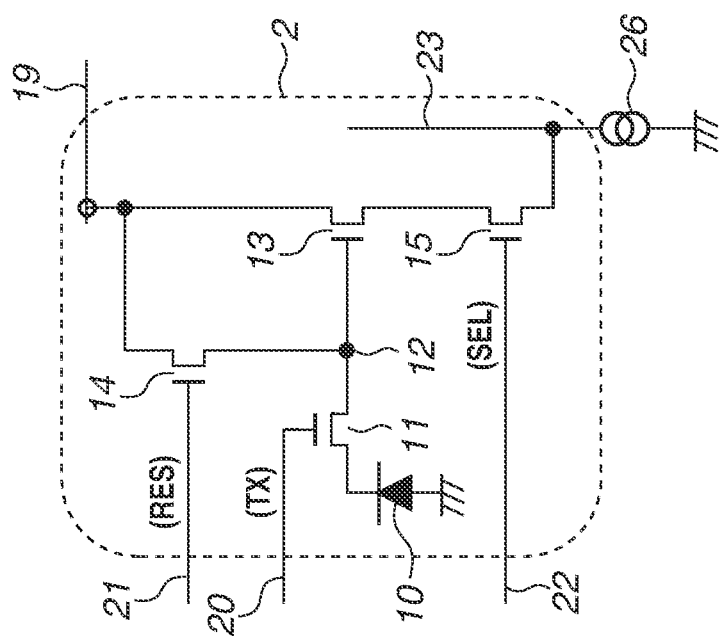

FIG. 2A illustrates an example of a circuit configuration of the pixel circuit 2. The pixel circuit 2 can include a photoelectric conversion element 10 such as a photodiode, a transfer transistor 11, a floating node 12, an amplification transistor 13, a reset transistor 14, and a selection transistor 15. A transfer signal TX is applied to a gate terminal of the transfer transistor 11 via the transfer signal line 20. When the transfer signal TX is activated, a charge generated by photoelectric conversion in the photoelectric conversion element 10 is transferred to the floating node 12 by the transfer transistor 11. The floating node 12 is connected to a gate terminal of the amplification transistor 13, and a source potential of the amplification transistor 13 changes according to variation in a charge amount transferred to the floating node 12. The amplification transistor 13 constitutes a source follower in which a source is connected to a current source 26 via the selection transistor 15. A selection signal SEL is applied to a gate terminal of the selection transistor 15 via the selection signal line 22. When the selection signal SEL is activated, the selection transistor 15 outputs, to the output signal line 23, a signal corresponding to a gate potential of the amplification transistor 13 as a signal based on a charge generated by the photoelectric conversion element 10. A reset signal RES is applied to a gate terminal of the reset transistor 14 via the reset signal line 21. When the reset signal RES is activated, the reset transistor 14 resets a potential of the floating node 12. Further, the reset transistor 14 can reset the charge of the photoelectric conversion element 10.

FIG. 2B is a plane schematic diagram illustrating a layout example of the pixel circuit 2. Diagrams A and B in FIG. 2C are respectively cross-sectional schematic views of the pixel circuit along a line A-A' and a line B-B' in FIG. 2B.

A substrate 100 includes a semiconductor region 101 and an insulator region 102 on its surface. The semiconductor region 101 includes a plurality of impurity regions distinguished by impurity concentrations and conductivity types. The insulator region 102 for element isolation has a local oxidation of silicon (LOCOS) structure and/or a shallow trench isolation (STI) structure and defines the semiconductor region 101. The semiconductor region 101 functions as an active region and an element region, and the insulator region 102 functions as an inactive region and/or an element isolation region. An example in which a single pixel circuit 2 includes only one semiconductor region 101 is described here, however, a single pixel circuit 2 can includes a plurality of the semiconductor regions 101.

The semiconductor region 101 includes a p-type impurity region 141. The impurity region 141 is a well region. The pixel circuit 2 is formed in the impurity region 141. The photoelectric conversion element 10 in FIG. 2A is, for example, an embedded type photodiode and includes an n-type impurity region 142 which accumulates an electron as a signal charge. A p-type impurity region 143 is disposed between the impurity region 142 and a surface of the semiconductor region 101. The photoelectric conversion element 10 includes a depletion region. The depletion region is formed by the impurity region 142 and the impurity regions (the impurity regions 141, 143, and the like) forming a pn junction with the impurity region 142. The floating node 12 in FIG. 2A includes an n-type impurity region 144 to which a signal charge is transferred. The impurity region 144 is a floating diffusion region. The amplification transistor 13, the reset transistor 14, and the selection transistor 15 in FIG. 2A each includes an n-type impurity region 145. The impurity region 145 is a source-drain region. The source-drain region means an impurity region corresponding to at least one of a source and a drain of a transistor. Depending on a driving state and a layout, the same impurity region can be a source and a drain of the same transistor or different transistors. In the present example, a drain of the transfer transistor 11 is also a source of the reset transistor 14, and a drain of the amplification transistor 13 is also a drain of the reset transistor 14. In addition, the impurity region 142 of the photoelectric conversion element 10 is also a source of the transfer transistor 11.

As illustrated in FIGS. 2B and 2C, a plurality of gate electrodes is disposed on the semiconductor region 101 via a gate insulating film. The transfer transistor 11 in FIG. 2A includes a gate electrode 111, and the reset transistor 14 in FIG. 2A includes a gate electrode 112. The amplification transistor 13 in FIG. 2A includes a gate electrode 113, and the selection transistor 15 in FIG. 2A includes a gate electrode 114. At least a portion of each of the gate electrodes 111, 112, 113, and 114 is located above the semiconductor region 101 via the gate insulating film. Accordingly, portions located below the gate electrodes 111, 112, 113, and 114 of the semiconductor region 101 function as channel regions in which channels are formed. In the present example, a portion of each of the gate electrodes 111, 112, 113, and 114 is located above the insulator region 102 as the element isolation region. An insulator constituting the insulator region 102 suppresses generation of a parasitic channel below the gate electrode. An entire portion of each of the gate electrodes 111, 112, 113, and 114 may be located above the semiconductor region 101. In such a case, a portion of each of the gate electrodes 111, 112, 113, and 114 can be located above the channel region and a remaining portion thereof can be located above the element isolation region having a pn junction isolation structure. Each gate electrode contains, for example, silicon, germanium, or a mixture of silicon and germanium, and typically a polycrystalline material of these elements. A thickness of each gate electrode is, for example, 50 nm or more and 500 nm or less. The present exemplary embodiment is suitable for a case in which a thickness of each gate electrode is 100 nm or more and 400 nm or less, and especially a case of 200 nm or less. Each gate electrode may have a polycide structure including a polysilicon layer and a silicide.

An insulator member 151 covering the plurality of gate electrodes is disposed on the substrate 100. The insulator member 151 may be a laminated member including a plurality of insulator layers. The insulator member 151 includes a plurality of holes (contact holes).

A plurality of plugs (gate plugs) is disposed on the substrate 100 as a conductor member being in contact with the gate electrode. For example, there are a plug 121 being in contact with the gate electrode 111, a plug 123 being in contact with the gate electrode 112, a plug 125 being in contact with the gate electrode 113, and a plug 126 being in contact with the gate electrode 114. Further, a plurality of plugs (contact plugs) is disposed on the substrate 100 as a conductor member being in contact with the semiconductor region 101. For example, there are a plug 122 being in contact with the drain of the transfer transistor 11 in FIG. 2A, a plug 124 being in contact with the drain of the amplification transistor 13 in FIG. 2A, and a plug 127 being in contact with a source of the selection transistor 15. Each plug can include, for example, a conductive portion containing tungsten as a main component and a barrier metal portion containing titanium and titanium nitride as main components.

Wirings connected to the gate plugs and the contact plugs are disposed on the insulator member 151. The wirings include global wirings, such as the signal lines 20, 21, 22, and 23 and the power source line 19 and also a local wiring 16 (see FIG. 2C). The local wiring 16 connects the impurity region 144 with the gate electrode 113 and can be a part of the floating node 12. Each wiring can include a conductive portion containing aluminum and copper as main components and a barrier metal portion containing titanium, titanium nitride, tantalum, and tantalum nitride as main components. The wirings are formed by a plurality of wiring layers. An insulator member 152 insulates between wirings in the same wiring layer and between different wiring layers.

The gate plugs and the contact plugs as conductor members are in contact with the gate electrode and the semiconductor region through holes of the above-described insulator member 151. The gate plugs and the contact plugs are disposed only inside of the holes of the insulator member 151. In this case, a conductor member being in contact with the gate electrode or the semiconductor region can be made of a material different from a wiring disposed outside of the hole of the insulator member 151.

The plugs 122, 124, and 127 (contact plugs) being in contact with the semiconductor region 101 are inevitably located above the semiconductor region 101. However, the plugs 121, 123, 125, and 126 (gate plugs) being in contact with the gate electrodes can be located above the semiconductor region 101 or above the insulator region 102.

Among a plurality of the gate plugs, for example, the plug 125 is located above the insulator region 102. In other words, the plug 125 is in contact with a portion located above the insulator region 102 of the gate electrode 113.

If a plug exists above the channel region in the transistor, may be a cause of noise. For example, in the amplification transistor 13 (see FIG. 2A) for generating a signal, noise generated in the channel region is likely to be a cause of fixed pattern noise. According to the present exemplary embodiment, the plug 125 connected to the gate electrode 113 of the amplification transistor is disposed on the insulator region 102 and thus noise can be suppressed.

On the other hand, among the plurality of the gate plugs, for example, the plugs 121, 123, and 126 are located above the semiconductor region 101. Further, the plugs 121, 123, and 126 are respectively in contact with portions located above the semiconductor region 101 in the gate electrodes 111, 112, and 114.

An effect of noise in the channel region is small in the reset transistor and the selection transistor having a switch function of mainly switching ON and OFF, so that the plugs 121, 123, and 126 are located above the semiconductor region 101. Accordingly, areas of portions located above the insulator regions 102 of the corresponding gate electrodes 112 and 114 are reduced, and the pixel circuit 2 can be miniaturized.

In the present example, the plug 121 of the transfer transistor for handling a signal charge is located above the semiconductor region 101, however, the plug 121 may be located above the insulator region 102 to suppress noise such as a dark current.

The gate electrode 113 includes a high concentration portion 154 of which impurity concentration is higher than another portion (a low concentration portion) in the gate electrode 113. Accordingly, resistance of the gate electrode 113 becomes low, and if the plug 125 is disposed on the insulator region 102, the gate electrode 113 can operate at high speed. The plug 125 can be in contact with the high concentration portion 154. A net conductivity type ("net" is the opposite of "gross") of the high concentration portion 154 is the same as the conductivity type (n-type) of the transistor including the gate electrode 113. However, if resistance between the gate electrode 113 and the plug 125 can be lowered, an impurity having a conductivity type (p-type) opposite to that of the transistor including the gate electrode 113 can be introduced to the high concentration portion 154.

In contrast, the impurity concentrations of the gate electrodes 111, 112, and 114 are entirely on the same level as that the low concentration portion of the gate electrode 113. In other words, the whole of the gate electrodes 111, 112, and 114 are the low concentration portions. The plugs 121, 123, and 126 are in contact with the low concentration portions. Accordingly, the impurity concentration of a portion (the high concentration portion 154) being in contact with the plug 125 of the gate electrode 113 is higher than the impurity concentrations of portions (the low concentration portions) being in contact with the plugs 121, 123, and 126 of the gate electrodes 111, 112, and 114. The impurity concentration of the entire gate electrode 113 may be set higher than the impurity concentrations of the gate electrodes 111, 112, and 114.

Next, a first example of a manufacturing method of the photoelectric conversion device according to the first exemplary embodiment is described with reference to FIGS. 3A to 3D.

First, the insulator region 102 having an element isolation structure such as a LOCOS structure and a STI structure is formed on, for example, a p-type silicon substrate. Accordingly, as illustrated in FIG. 3A, a region is separated to the semiconductor region 101 including the p-type impurity region 141 and the insulator region 102. Next, the gate insulating film 109 is formed, and then a conductor film 110 is formed on the gate insulating film 109. The conductor film 110 may be made of a semiconductor material including an impurity. Silicon, germanium, or a mixture of silicon and germanium is appropriate for the semiconductor material.

The conductor film 110 containing the impurity can be formed by a first method as described below. For example, an amorphous film of the semiconductor is formed on the substrate 100 by a chemical vapor deposition method. For the amorphous film, an amorphous silicon film is appropriate of which a film thickness is 100 to 300 nm (for example, 150 nm). More specifically, an amorphous silicon film can be formed in an atmosphere of a silane based gas (for example, $SiH_4$) under conditions of 500 to 650° C.(for example, 580° C.) in a reaction temperature and 15 to 60 Pa (for example, 30 Pa) in a gas pressure.

Then, an impurity is introduced to the amorphous film by ion implantation and the like. The amorphous film is polycrystallized as necessary. For example, phosphorus ions are introduced to the amorphous silicon film in a dose amount of $1*10^{15}$ ions/cm$^2$ and at an accelerating voltage 20 keV. Further, the amorphous silicon film is annealed in a nitrogen atmosphere at 600° C. for 60 seconds, so that a polysilicon film containing the impurity can be formed. At that time, it is desirable that energy of the ion implantation is set so that a sum of a range distance Rp and six times a standard deviation of the range ΔRp (i.e., Rp+6ΔRp) is smaller than a film thickness of the gate electrode.

In addition, the conductor film 110 containing the impurity can be formed by a second method as described below. For example, a polycrystalline film is formed on the substrate 100 using a gas containing the impurity by the chemical vapor deposition method. For the polycrystalline film, an amorphous silicon film is appropriate of which a film thickness is 300 to 500 nm (for example, 400 nm). More specifically, a polysilicon film including phosphorus as the impurity can be formed in an atmosphere of a mixed gas of $SiH_4$ and $PH_3$ under conditions of 500 to 650° C. (for example, 540° C.) in a reaction temperature and 30 to 100 Pa (for example, 70 Pa) in a gas pressure. At that time, it is desirable that the impurity concentration near a surface of the gate electrode is $1*10^{17}$ atoms/cm$^3$ or more. According to the present exemplary embodiment, polarity of the gate electrode is described as an n-type as an example, however, polarity of all or a part of the gate electrodes can be a p-type opposite to the n-type. In such a case, it is desirable that the impurity concentration near the surface of the gate electrode is $2*10^{17}$ atoms/cm$^3$ or more.

Next, the conductor film 110 is subjected to patterning using photolithography. Accordingly, as illustrated in FIG. 3B, the gate electrode 111 of the transfer transistor, the gate electrode 112 of the reset transistor, the gate electrode 113 of the amplification transistor, and the gate electrode 114 of the selection transistor are formed.

After the patterning of the gate electrode, the n-type impurity region 142, the p-type impurity region 143, and the n-type impurity region 144 are formed by, for example, ion implantation. The n-type impurity region 142, the p-type impurity region 143, and the n-type impurity region 144 can be formed before the film formation of the gate electrode. It is desirable that a surface concentration of the n-type impurity region 144 is set to $5*10^{16}$ atoms/cm$^3$ or less from viewpoints of reduction in capacity of the floating node 12, hot carrier resistance of the MOS transistor of the pixel circuit 2, and the like. When the impurity regions 142, 143, and 144 are formed after the patterning of the gate electrode, it is desirable to mask the gate electrode with photoresist and the like so that an unnecessary impurity is not introduced to the gate electrode.

Next, an insulator film is formed on the substrate 100. The insulator film is subjected to planarization processing by chemical mechanical polishing (CMP), etch back, reflow, and the like, as necessary. Then, a plurality of holes to be the contact holes is formed on the insulator film using the photolithography. The plurality of holes as the contact holes includes holes 161, 163, and 166 to which the plugs 121, 123, and 126 are provided later. The plurality of holes includes a hole 165 to which the plug 125 is provided later. The plurality of holes includes holes 162, 164, and 167 to which the plugs 122, 124, and 127 are provided later. Accordingly, as illustrated in FIG. 3C, the insulator member 151 including the plurality of holes is formed from the above-described insulator film. Then, a photosensitive resin film (a photoresist film) is formed on the insulator member 151, and the photosensitive resin film is subjected to patterning using the photolithography. Accordingly, a resin made mask 171 is formed from the photosensitive resin film. The mask 171 covers the holes 161, 163, and 166 among the plurality of holes. On the other hand, the mask 171 does not cover the holes 162, 164, 165, and 167 among the plurality of holes because of openings 131, 132, and 133 disposed on the mask 171.

The impurity is selectively introduced to at least a portion corresponding to a hole disposed on the insulator member 151 in the semiconductor region 101 in the MOS transistor of the pixel circuit 2 through the openings 131, 132, and 133 of the mask 171 and the holes 162, 164, and 167. According to the present exemplary embodiment, ion implantation is performed on a source-drain region on which the openings 131, 132, and 133 are disposed and further the holes 162, 164, 165, and 167 are formed. At the same time, the impurity is selectively introduced to a portion corresponding to the hole 165 of the gate electrode 113 through the opening 132 of the mask 171 and the hole 165. It is desirable that a conductivity type of the impurity implanted in the present process is the same as a conductivity type (n-type) of the source-drain region, however, an impurity having a conductivity type (p-type) opposite to the source-drain region may be introduced in a region in which the gate electrode 113 can be conducted to a conductor member.

Then, the anneal processing is appropriately performed, and thus a contact region 153 of which an impurity concentration is higher than the other portions of the source-drain region is formed in the source-drain region. In addition, the high concentration portion 154 of which the impurity concentration is higher than the other portions is formed on the gate electrode 113. Conditions of ion implantation performed when the source-drain region is formed is referred to as a first dose amount and a first implantation energy. When the contact region 153 is formed, the ion implantation can be adopted which uses a second dose amount higher than the first dose amount and a second implantation energy lower than the first implantation energy. The ion implantation in the source-drain region can be performed under the conditions that a dose is $10^{13}$ ions/cm$^2$ or more and $10^{15}$ ions/cm$^2$ or less, and an accelerating voltage is 10 keV or more and 40 keV or less. For example, a dose amount of phosphorus ions is set to $1*10^{14}$ ions/cm$^2$ and an accelerating voltage is set to 20 keV. For example, the impurity concentration of the contact region 153 disposed on the impurity region 144 is desirably $1*10^{17}$ atoms/cm$^3$ or more.

According to the present exemplary embodiment, n-type charge accumulation regions and n-type MOS transistors are described as examples, however, a p-type MOS transistor having an opposite polarity can be adopted. In such a case, the impurity concentration of the contact region 153 is desirably $2*10^{17}$ atoms/cm$^3$ or more.

Next, after removing the photoresist, for example, a titanium (Ti) layer with about 10 nm in thickness, a titanium nitride (TiN) layer with about 30 nm in thickness are formed as barrier metal portions of the plugs 121 to 127, and, for example, a tungsten layer with about 200 nm in thickness is formed as conductive portions of the plugs 121 to 127. Then, extra tungsten and barrier metal portions are removed by CMP or the like, and thus, as illustrated in FIG. 3D, the conductor member is embedded in the contact hole. The barrier metal portions may include tantalum (Ta), tantalum nitride (TaN), and others as well. Then, wirings connected to each of plugs are appropriately formed. Further, a passivation film, a color filter array, and a microlens array are formed, so that the photoelectric conversion device is completed. In FIG. 2B, a section in which a single color filter in the color filter array or a single microlens in the microlens array is disposed is indicated as a section P. The section P can be handled as a pixel.

According to the present exemplary embodiment, the plugs 121, 123, and 126 being in contact with the gate electrode 111 of the transfer transistor, the gate electrode 112 of the reset transistor, and the gate electrode 114 of the selection transistor are formed above the semiconductor region 101 (above the channel region). In contrast, the plug 125 being in contact with the gate electrode 113 of the amplification transistor is formed above the insulator region 102. Further, according to the present exemplary embodiment, the impurity concentration of the portion to which the plug 125 of the gate electrode 113 is connected is higher than the impurity concentration of the portion to which a plug of another gate electrode is connected. This is because the ion implantation is selectively performed by the openings 131, 132, and 133.

A reason why the ion implantation is not performed on a portion located above the semiconductor region 101 (the channel region) of the gate electrode is described below. If the ion implantation is performed on the gate electrode made of a polycrystallized semiconductor material, there is a possibility to cause a sub-channeling phenomenon and penetration of a void at a grain boundary portion. It is difficult to prevent such phenomena from occurring by ion implantation angle control, such as interstitial channeling and lattice scattering. Therefore, the impurity may penetrate through the gate electrode and reach the gate insulating film and the semiconductor substrate therebelow. Especially, in a case where a region to which the impurity is implanted is located above the channel region of the semiconductor region 101, and if the impurity is unintentionally introduced to the channel region, a threshold value of a transistor is shifted, and deterioration of characteristics and a malfunction may occur in the photoelectric conversion device. According to the present exemplary embodiment, in the gate electrode 113, the impurity is introduced to a portion located above the insulator region 102 to form the high concentration portion 154, and the plug 125 is in contact with the high concentration portion 154. The portion to which the impurity is introduced (the high concentration portion 154) of the gate electrode 113 is formed on the insulator region 102 made of a thick insulator (the STI in the example). Therefore, there is no effect if the implanted impurity penetrates through the gate electrode 113. Further, disposing the high concentration portion 154 makes resistance to the plug 125 smaller and enables a high speed operation.

On the other hand, the holes 161, 163, and 166 on the gate electrodes 111, 112, and 114 are formed above the channel region of the semiconductor region 101. The gate electrodes 111, 112, and 114 are in contact with the plugs 121, 123, and 126 at portions located above the semiconductor region 101. Thus, a degree of freedom for a layout of the MOS transistor for the pixel circuit can be improved. The holes 161, 163, and 166 on which the plugs 121, 123, and 126 are disposed are covered by the mask 171, so that the impurity is not casually introduced to the channel region below the holes 161, 163, and 166. Accordingly, characteristics of the pixel circuit can be optimized. Regarding connections between the plugs 121, 123, and 126 and the gate electrodes 111, 112, and 114, the conductor film 110 for forming the gate electrodes 111, 112, and 114 contains the impurity, so that resistance of the gate electrodes 111, 112, and 114 are low in advance. Therefore, the gate electrodes 111, 112, and 114 can ensure sufficiently high conductivity without disposing the high concentration portion. Regarding the formation of the conductor film 110, in the first method, introduction of the impurity to the conductor film (the gate electrode) is performed by the ion implantation not in the polycrystalline film but in the amorphous film. Accordingly, penetration of ions through the conductor film (the gate electrode) can be suppressed compared to the case that the ion implantation is performed on the polycrystalline film. In the second method, introduction of the impurity to the conductor film (the gate electrode) is performed not in the ion implantation but in the film formation. Therefore, unnecessary introduction of the impurity to the semiconductor region 101 can be suppressed.

Next, a second example of the manufacturing method of the photoelectric conversion device according to the first exemplary embodiment is described with reference to FIGS. 5A and 5B. FIGS. 5A and 5B partially illustrate the manufacturing method different from the first example. Diagrams A and B in FIG. 5A are respectively cross-sectional schematic views of the pixel circuit along the line A-A' and the line B-B' in FIG. 2B.

Before the insulator member 151 and the holes 161 to 167 are formed, the photosensitive resin film (the photoresist film) is formed on the substrate 100, and the photosensitive resin film is subjected to patterning using the photolithography. Accordingly, a resin made mask 172 is formed from the photosensitive resin film. Openings 134, 135, and 136 are disposed on the mask 172. The impurity is introduced to the semiconductor region 101 and the gate electrode 113 by the ion implantation through the openings 134, 135, and 136. The ion implantation is performed only on a region in which the openings 134, 135, and 136 of the mask 172 are opened. Then, the anneal processing is appropriately performed, and thus the contact region 153 and the high concentration portion 154 are formed.

Then, an insulator film 150 covering the contact region 153 and the high concentration portion 154 is formed. The planarization processing is performed on the insulator film 150 to a position indicated by a dotted line in FIG. 5B. Then, holes for exposing the contact region 153, the high concentration portion 154, or the gate electrodes 111, 112, and 114, where the contact region 153 and the high concentration portion 154 are not formed, are formed on the insulator film 150 after the planarization processing similar to the holes 161 to 167 in FIG. 3C. Accordingly, the insulator member 151 including the holes 161 to 167 is formed similar to the first example. Then, as similar in FIG. 3D, the plugs 121 to 127 are formed which are in contact with the contact region 153, the high concentration portion 154, or the gate electrodes 111, 112, and 114, where the contact region 153 and the high concentration portion 154 are not formed, through the holes 161 to 167. As in the present example, the contact region 153 and the high concentration portion 154 can be formed before the formation of the insulator member 151 as long as it is after the patterning of the gate electrode.

Next, a configuration of a photoelectric conversion device according to a second exemplary embodiment is described with reference to FIGS. FIG. 4A to 4C.

Figure 4A:
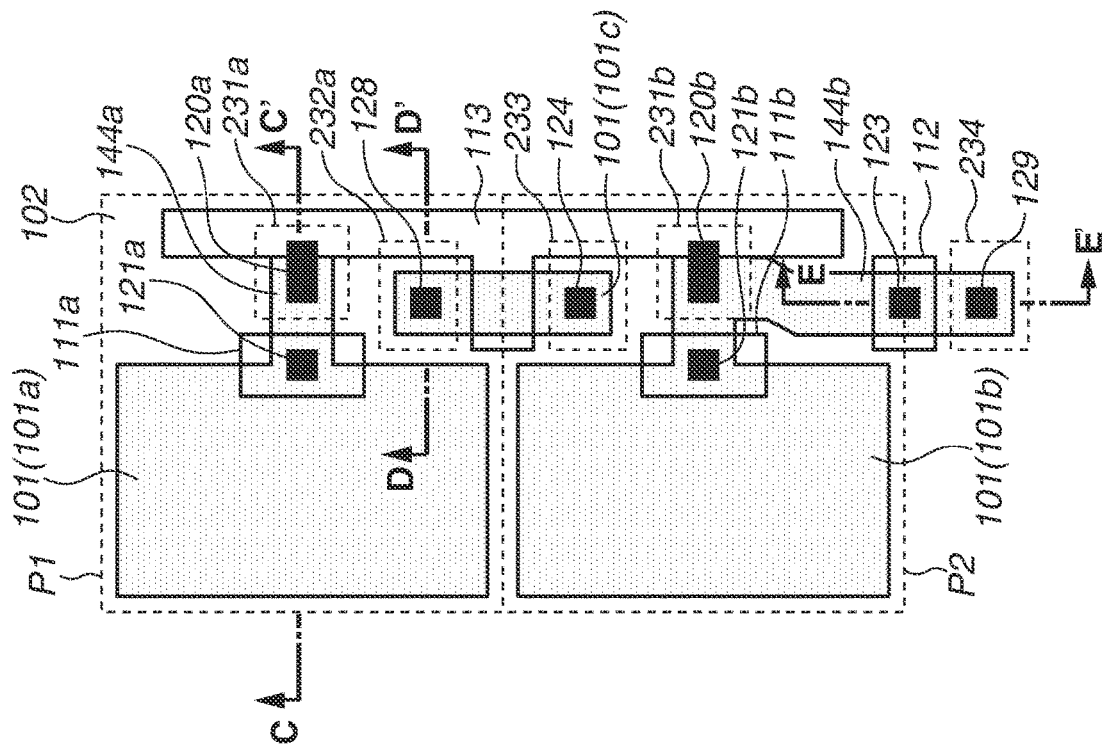

FIG. 4A illustrates an example of the circuit configuration of the pixel circuit 2. Diagrams C, D, and E in FIG. 4C are respectively cross-sectional schematic views of the pixel circuit along a line C-C', a line D-D', and a line E-E' in FIG. 4B. A diagram F in FIG. 4C is a cross-sectional schematic view of the MOS transistor 15 included in portions other than the pixel unit 18 in FIG. 1, namely peripheral circuits such as the driving unit 24, the signal processing unit 25, the control unit 27, and the output unit 29. Descriptions of points which are not different from those in the first exemplary embodiment are omitted by assigning the same reference numerals or common reference numerals except attached alphabets used in the first exemplary embodiment.

According to the present exemplary embodiment, an example of a circuit configuration of the pixel circuit is described in which a plurality of photoelectric conversion elements 10a and 10b and transfer transistors 11a and 11b share an amplification transistor 13 and a reset transistor 14. In addition, a selection transistor and a selection signal line 22 are not included in the circuit configuration example. In FIGS. 3A to 3D, two photoelectric conversion elements 10a and 10b share the amplification transistor 13 and the reset transistor 14, however, the present exemplary embodiment is not limited to this circuit configuration, and three or more photoelectric conversion elements 10 may share them.

The semiconductor region 101 includes a first element region 101a, a second element region 101b, and a third element region 101c defined by the insulator region 102 as the element isolation region. The first element region 101a includes the photoelectric conversion element 10a and the transfer transistor 11a. The second element region 101b includes the photoelectric conversion element 10b, the transfer transistor 11b, and the reset transistor 14. The third element region 101c includes the amplification transistor 13.

A plug 121a is disposed to each of the transfer transistors 11a and 11b and gate electrodes 111a and 111b. The gate electrode 113 of the amplification transistor 13 is extended on the semiconductor region 101, specifically from the channel region of the second element region 101b to the insulator region 102. The gate electrode 113 is connected to the semiconductor region 101, specifically to impurity regions 144a and 144b by respective plugs 120a and 120b. The plug 120a is in contact with both of the gate electrode 113 and the impurity region 144a of the semiconductor region 101, and the plug 120b is in contact with both of the gate electrode 113 and the impurity region 144b of the semiconductor region 101. As described above, according to the present exemplary embodiment, the plugs 120a and 120b as conductor members have a shared contact structure. A plug 128 connected to the output signal line is in contact with a source of the amplification transistor 13 not via the selection transistor. The impurity regions 144a, 144b, and 145 include the contact region 153 which is the high concentration portion. The gate electrode 113 also includes the high concentration portion 154. The plugs 120a and 120b are in contact with the contact region 153 and the high concentration portion 154. In the present example, portions with which the plugs 120a and 120b of the gate electrode 113 are in contact are located above the insulator region 102. However, the portions with which the plugs 120a and 120b of the gate electrode 113 are in contact may be located above the semiconductor region 101 or above the both of the semiconductor region 101 and the insulator region 102.

A plug 129 is in contact with a drain of the reset transistor 14. Wirings such as the power source line 19 and the signal lines 20 to 23 connected to each of the plugs 120 to 129 contain, for example, copper as a main component.

The MOS transistor 15 is, for example, a positive channel metal oxide semiconductor (PMOS) transistor or a negative channel metal oxide semiconductor (NMOS) transistor constituting a complementary metal oxide semiconductor (CMOS) circuit. The MOS transistor 15 having a lightly doped drain (LDD) structure includes a source-drain region including the impurity region 146 with a low impurity concentration and the impurity region 147 with a high impurity concentration. The impurity concentration of the impurity region 147 may be higher than the impurity concentrations of the impurity regions 144 and 145. A silicide layer 155 of cobalt silicide, molybdenum silicide, and the like is disposed on the impurity region 147 of the MOS transistor 15, and a plug 157 is in contact with the silicide layer 155. A silicide layer 156 of cobalt silicide, molybdenum silicide, and the like is disposed on a gate electrode 115 of the MOS transistor 15, and a plug 158 is in contact with the silicide layer 156.

Figure 4B:
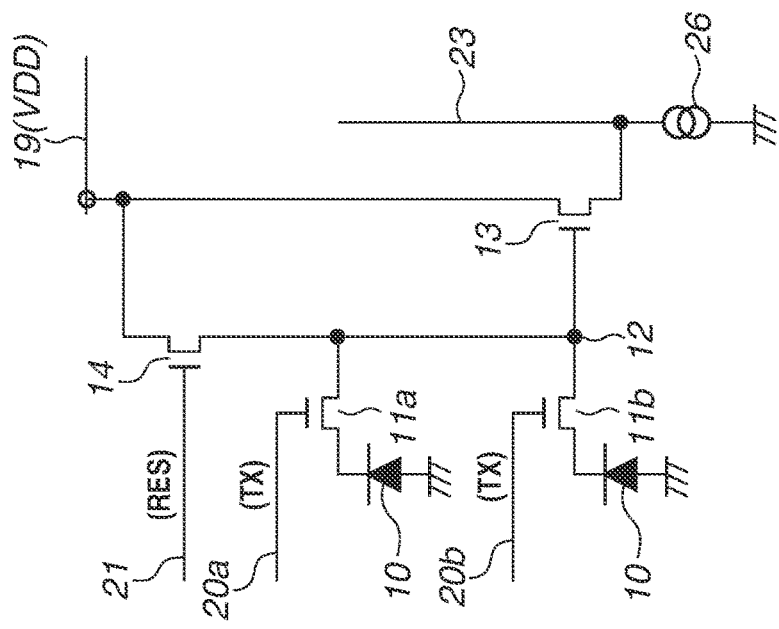

In FIG. 4B, a section in which a single color filter in the color filter array or a single microlens in the microlens array is disposed is indicated as a section P1 or P2. Each of the sections P1 and P2 can be handled as a pixel.

Next, a first example of the manufacturing method of the photoelectric conversion device according to the second exemplary embodiment is described with reference to FIG. 5C. FIG. 5C partially illustrates a manufacturing process different from the first example of the manufacturing method according to the first exemplary embodiment. Diagrams C, D, and E in FIG. 5C are respectively cross-sectional schematic views of the pixel circuit along a line C-C', a line D-D', and a line E-E' in FIG. 3B.

According to the second exemplary embodiment, the same processes according to the first exemplary embodiment are adopted up to the processes illustrated in FIG. 3B except for a difference in a layout of the circuit.

After the processes illustrated in FIG. 3B, the impurity region 146 of the MOS transistor 15 (see FIG. 4C) included in the peripheral circuit is formed. Further, a sidewall spacer is formed on a side surface of the gate electrode 115, and the impurity region 147 is formed with a dose higher than that of the formation of the impurity region 146. The impurity region 147 is formed, for example, by the ion implantation and the anneal processing at 600° C. or higher.

Further, the MOS transistor 15 is subjected to silicidation. At that time, a salicide process can be adopted which protects the transistor of the pixel unit 18 from silicidation by a protective film (a silicide block film). Accordingly, as described with reference to FIG. 4C, the silicide layer 155 is formed on the source-drain region of the MOS transistor 15 in the peripheral circuit, and the silicide layer 156 is formed on a surface of the gate electrode 115.

Next, as illustrated in FIG. 5C, an insulator member 251 including a plurality of holes is formed. The insulator member 251 includes holes 168 and 169 above the semiconductor region 101. Further, the insulator member 251 respectively includes holes 161a and 163 on the gate electrodes 111a and 112. Furthermore, the insulator member 251 includes a hole 160a above the semiconductor region 101 and on the gate electrode 113. Next, a mask 271 is formed similar to that in the first example of the manufacturing method according to the first exemplary embodiment. The mask 271 covers the holes 161a and 163. On the other hand, since openings 231, 232, and 233 are disposed on the mask 271, the mask 271 does not cover the holes 160a, 168, and 169 among the plurality of holes. The impurity is introduced to the impurity region 145 of the semiconductor region 101 by the ion implantation through the openings 232 and 233 and the holes 168 and 169 to form the contact region 153. In addition, the impurity is introduced to the impurity region 144a by the ion implantation through the opening 231 and the hole 160a to form the contact region 153, and the impurity is introduced to the gate electrode 113a to form the high concentration portion 154. A portion located on the gate electrode 113a of the hole 160a may be located only above the insulator region 102, only above the semiconductor region 101a, or above both of the semiconductor region 101 and the insulator region 102. A reason why the hole 160a may be located above the semiconductor region 101 is that the semiconductor region 101 below the hole 160a is not the channel region but the source-drain region or a region which does not substantially affect an operation of the transistor. A portion of the impurity introduced to the gate electrode 113a to form the high concentration portion 154 may be introduced to the semiconductor region 101 by penetrating through the gate electrode 113a. However, if the impurity is introduced to a region other than the channel region of the transfer transistor 11a, effects on a threshold value and transfer characteristics are small compared to the case that the impurity is introduced to the channel region.

Next, a plurality of plugs including the plugs 120a and 120b illustrated in FIG. 4C is formed. In addition, wirings connected to the plurality of plugs are formed. A damascene process can be adopted to formation of wirings mainly containing copper. A silicide layer (not illustrated) may be formed between the contact region 153 and the high concentration portion 154 after the plurality of plugs is formed in the pixel region. The silicide layer is formed by reaction of tungsten and/or titanium contained in the plugs 121 to 127 themselves and silicon contained in the substrate and the gate electrodes 111 to 114. The silicide layer formed on the MOS transistor of the pixel circuit can be formed later than the above-described salicide process performed on the MOS transistor of the peripheral circuit. As described above, a metallic component of the silicide layer formed on the MOS transistor of the pixel circuit accompanying the formation of the plugs 121 to 127 may be different from that of the silicide layers 155 and 156. For example, tungsten silicide and titanium silicide are formed on the MOS transistor of the pixel circuit, whereas cobalt silicide and nickel silicide can be formed on the MOS transistor of the peripheral circuit. A fact that the gate electrodes 111 to 114 include the silicide layers below the plugs 121 to 127 is advantageous for the MOS transistor of the pixel circuit in reduction of resistance between the gate electrodes 111 to 114 and the plugs 121 to 127.

A second example of the manufacturing method of the photoelectric conversion device according to the second exemplary embodiment is performed similar to the second example of the manufacturing method of the photoelectric conversion device according the first exemplary embodiment. More specifically, as illustrated in FIG. 5D, before forming the insulator member 151, a mask 272 is formed which is obtained by performing patterning on the photosensitive resin film. Openings 234 and 235 are disposed on the mask 272. The impurity is introduced to the impurity region 145 by the ion implantation through the opening 235 to form the contact region 153. In addition, the impurity is introduced to the impurity region 144a by the ion implantation through the opening 234 to form the contact region 153, and the impurity is introduced to the gate electrode 113a to form the high concentration portion 154.

A third example of the manufacturing method of the photoelectric conversion device according to the second exemplary embodiment is described with reference to FIG. 5C. After the formation of the insulator film 150 and planarization, the holes 160a, 168, and 169 are formed without forming the holes 161a and 163. Then, the impurity is introduced to the gate electrode 113 and the impurity regions 153 and 145 through the holes 160a, 168, and 169. Accordingly, the contact region 153 and the high concentration portion 154 are formed. At that time, the gate electrodes 111a and 112 are covered by the insulator film 150 without the holes 161a and 163, the insulator film 150 serves as a mask to prevent the impurity from being introduced to the gate electrodes 111a and 112. Then, the holes 161a and 163 are formed, so that the plugs 121a and 123 can be formed without introducing the impurity through the holes 161a and 163. The plugs 120a, 128, and 129 may be formed to the holes 160a, 168, and 169 after the formation of the holes 161a and 163. When the holes 161a and 163 are formed before the formation of the holes 160a, 168, and 169, the holes 161a and 163 may be covered by the resist as in the first example of the second exemplary embodiment.

Accordingly, the above-described exemplary embodiments can provide a technique advantageous for improving performance of a photoelectric conversion circuit. The above-described exemplary embodiments can be appropriately modified without departing from the technical idea thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A manufacturing method of a photoelectric conversion device, the manufacturing method comprising:
    forming a gate electrode of a MOS transistor on a substrate, the gate electrode including a first portion;
    forming a drain region of the MOS transistor in the substrate, the drain region including a second portion, the drain region having a conductivity type;
    introducing an impurity in the second portion of the drain region, with the first portion of the gate electrode being masked, and the impurity having a conductivity type same as the conductivity type of the drain region;
    forming a first conductor member being in contact with the first portion which is constituted by polysilicon, the first conductor member being formed in a first hole of an insulator member; and
    forming a second conductor member being in contact with the second portion, the second conductor member being formed in a second hole of the insulator member.

2. The manufacturing method of the photoelectric conversion device according to claim 1, wherein the first hole is on the first portion of the gate electrode, and the second hole is on the second portion of the drain region, wherein the second conductor member is in contact with a semiconductor which constitutes the drain region.

3. A manufacturing method of a photoelectric conversion device, the manufacturing method comprising:
    forming a gate electrode of a MOS transistor on a substrate, the gate electrode including a first portion;
    forming a drain region of the MOS transistor in the substrate, the drain region including a second portion;
    introducing an impurity in the second portion of the drain region, with the first portion of the gate electrode being masked, the first portion being constituted by polysilicon, and the impurity having a conductivity type same as a conductivity type of the drain region;

forming a first conductor member being in contact with the first portion, the first conductor member being formed in a first hole of an insulator member; and forming a second conductor member being in contact with the second portion, the second conductor member being formed in a second hole of the insulator member, wherein the impurity is introduced to the second portion through the second hole.

4. The manufacturing method of the photoelectric conversion device according to claim 3, wherein the impurity is introduced to the second portion through the second hole with the first hole being masked.

5. The manufacturing method of the photoelectric conversion device according to claim 1, comprising:

forming, on the substrate, an insulator film covering the gate electrode and the drain region of the MOS transistor; and performing a planarization on the insulator film, wherein the first hole is formed by etching the insulator film after the planarization, and wherein the first portion of the gate electrode is arranged between the first conductor member and an element region of the substrate, and the element region of the substrate is defined by an element isolation region.

6. The manufacturing method of the photoelectric conversion device according to claim 1, comprising:

forming, on the substrate, an insulator film covering the gate electrode and the drain region of the MOS transistor; and forming the insulator member from the insulator film, wherein the insulator member is formed after the introducing, and the impurity is introduced to the second portion through an opening of a resin film covering the gate electrode.

7. The manufacturing method of the photoelectric conversion device according to claim 3, comprising forming the first hole and forming the second hole, wherein the impurity is introduced between the forming of the first hole and the forming of the second hole.

8. The manufacturing method of the photoelectric conversion device according to claim 7, wherein the forming of the first hole is after the forming of the second hole.

9. The manufacturing method of the photoelectric conversion device according to claim 1, wherein the drain region is formed by ion implantation using a first dose amount and a first implantation energy, and the impurity is introduced to the second portion by ion implantation using a second dose amount higher than the first dose amount and a second implantation energy lower than the first implantation energy.

10. The manufacturing method of a photoelectric conversion device according to claim 8, wherein the forming of the second conductor member is after the forming of the first hole.

11. The manufacturing method of the photoelectric conversion device according to claim 4, wherein the forming of the first conductor member is after the introducing.

12. The manufacturing method of the photoelectric conversion device according to claim 10, wherein, the first portion of the gate electrode is arranged between the first conductor member and an element region of the substrate.

13. The manufacturing method of the photoelectric conversion device according to claim 3, wherein the forming of the gate electrode includes forming, on the substrate, a conductor film containing an impurity, and wherein the gate electrode is formed by patterning the conductor film.

14. The manufacturing method of the photoelectric conversion device according to claim 13, wherein the forming of the conductor film includes forming a silicon film on the substrate, and the conductor film is formed by introducing an impurity to the silicon film.

15. The manufacturing method of the photoelectric conversion device according to claim 14, wherein the silicon film is an amorphous silicon film, and the forming of the conductor film includes polycrystallizing the silicon film.

16. The manufacturing method of the photoelectric conversion device according to claim 13, wherein the conductor film is formed using a gas including the impurity contained in the conductor film.

17. The manufacturing method of the photoelectric conversion device according to claim 12, wherein the element region of the substrate is defined by an element isolation region including an insulator.

18. A manufacturing method of a photoelectric conversion device, the manufacturing method comprising:

forming a gate electrode of a MOS transistor on a substrate, the gate electrode including a first portion;

forming a drain region of the MOS transistor in the substrate, the drain region including a second portion;

introducing an impurity in the second portion of the drain region, with the first portion of the gate electrode being masked, the first portion being constituted by polysilicon, and the impurity having a conductivity type same as a conductivity type of the drain region;

forming a first conductor member being in contact with the first portion, the first conductor member being formed in a first hole of an insulator member; and forming a second conductor member being in contact with the second portion, the second conductor member being formed in a second hole of the insulator member, wherein a third hole of the insulator member is above an insulator of a element isolation region, and another electrode is arranged between the insulator of the element isolation region and the third hole, and in the introducing, a impurity is introduced to the another electrode through the third hole.

19. The manufacturing method of the photoelectric conversion device according to claim 3, wherein the impurity is phosphorus, and phosphorus is not introduced to the first portion through the first hole.

20. The manufacturing method of the photoelectric conversion device according to claim 3, wherein the MOS transistor is a transfer transistor which transfer a charge generated by a photoelectric conversion to the drain region.

21. A manufacturing method of a photoelectric conversion device provided with a MOS transistor, the manufacturing method comprising:

forming, on a substrate, an insulator member covering a gate electrode and a source-drain region of the MOS transistor, the source-drain region having a conductivity type, the insulator member having a first hole and a second hole, the first hole being on a first portion located in the gate electrode and above an element region of the substrate, and the second hole being on a second portion located in the source-drain region;

introducing an impurity having a conductivity type same as the conductivity type of the source-drain region to the second portion in a state in which the first hole is masked; and forming a conductor member being in contact with the first portion through the first hole and a conductor member being in contact with the second portion through the second hole, wherein the first portion is constituted by polysilicon.

22. The manufacturing method of the photoelectric conversion device according to claim 21, further comprising forming, on the substrate, an insulator film covering the gate electrode and the source-drain region of the MOS transistor, and etching the insulator film to form the insulator member having the first hole and the second hole.

23. The manufacturing method of the photoelectric conversion device according to claim 21, further comprising forming, on the substrate, a conductor film containing an impurity, and forming the gate electrode including the first portion by performing patterning on the conductor film.

24. The manufacturing method of the photoelectric conversion device according to claim 23, wherein a silicon film is formed on the substrate, and the conductor film is formed by introducing an impurity to the silicon film.

25. The manufacturing method of the photoelectric conversion device according to claim 24, wherein the silicon film is an amorphous silicon film.

26. The manufacturing method of the photoelectric conversion device according to claim 21, wherein the source-drain region is formed by ion implantation using a first dose amount and a first implantation energy, and the impurity is introduced to the second portion by ion implantation using a second dose amount higher than the first dose amount and a second implantation energy lower than the first implantation energy.

27. The manufacturing method of the photoelectric conversion device according to claim 21, wherein the element region of the substrate is defined by an element isolation region including an insulator.

28. The manufacturing method of the photoelectric conversion device according to claim 27, wherein the insulator member has a third hole, and the second hole is above the insulator of the element isolation region, and an electrode is arranged between the insulator of the element isolation region and the third hole.

29. The manufacturing method of the photoelectric conversion device according to claim 21, wherein the impurity is phosphorus.

30. The manufacturing method of the photoelectric conversion device according to claim 21, wherein the MOS transistor is a reset transistor which resets a charge generated by a photoelectric conversion.

* * * * *